(12) United States Patent
Takamine et al.

(10) Patent No.: US 6,326,864 B1
(45) Date of Patent: Dec. 4, 2001

(54) SURFACE ACOUSTIC WAVE FILTER, DUPLEXER AND COMMUNICATIONS DEVICE WITH SPECIFIC SERIES RESONATOR MULTIPLE ANTI-RESONANT POINT PLACEMENT

(75) Inventors: Yuichi Takamine, Matto; Norio Taniguchi, Ishikawa-ken, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/510,843

(22) Filed: Feb. 23, 2000

(30) Foreign Application Priority Data

Mar. 11, 1999 (JP) .................................. 11-064906

(51) Int. Cl.$^7$ ................................ H03H 9/64; H03H 9/72
(52) U.S. Cl. ........................... 333/133; 333/193; 333/195
(58) Field of Search ........................... 333/133, 193–196; 310/313 R, 313 B, 313 C, 313 D

(56) References Cited

U.S. PATENT DOCUMENTS

| 5,729,186 | * | 3/1998 | Seki et al. | 333/194 |
| 5,760,664 | | 6/1998 | Allen | 333/194 |
| 5,844,453 | * | 12/1998 | Matsui et al. | 333/193 |
| 6,025,763 | * | 2/2000 | Morimoto | 333/195 |
| 6,031,435 | * | 2/2000 | Inose et al. | 333/193 |
| 6,137,380 | * | 10/2000 | Ushiroku et al. | 333/193 |

FOREIGN PATENT DOCUMENTS

| 0 795 958 | | 9/1997 | (EP) . |
| 9-55640 | * | 2/1997 | (JP) . |
| 9-331233 | | 12/1997 | (JP) . |

* cited by examiner

*Primary Examiner*—Robert Pascal
*Assistant Examiner*—Barbara Summons
(74) *Attorney, Agent, or Firm*—Keating & Bennett, LLP

(57) ABSTRACT

A surface acoustic wave filter includes at least two series arm surface acoustic wave resonators provided in an series arm and at least one parallel arm surface acoustic wave resonator provided in a parallel arm. At least one of the series arm surface acoustic wave resonators has a plurality of anti-resonant points and a sub-resonant point located between the anti-resonant points. The sub-resonant point substantially matches an anti-resonant point of at least one of the remaining series arm surface acoustic wave resonators.

18 Claims, 9 Drawing Sheets

SURFACE ACOUSTIC WAVE FILTER, DUPLEXER AND COMMUNICATIONS DEVICE WITH SPECIFIC SERIES RESONATOR MULTIPLE ANTI-RESONANT POINT PLACEMENT

BACKGROUND OF THE INVENTION

1. Field of the Invention

This invention relates to a surface acoustic wave filter used in a communications device for a high-frequency band, and more particularly, relates to a ladder-type surface acoustic wave filter.

2. Description of the Related Art

In general, a ladder-type surface acoustic wave filter includes one-port resonators arranged alternately in series arms and parallel arms, and achieves low insertion loss and a wide band, which are extremely good characteristics for a filter. In such a ladder-type surface acoustic wave filter, the anti-resonant frequency (hereinafter, in the present specification, the anti-resonant frequency will be referred to as the anti-resonant point) of the surface acoustic wave resonator connected in parallel (hereinafter abbreviated as parallel arm resonator) is matched with the resonant frequency (hereinafter, in the present specification, the resonant frequency will be referred to as the resonant point) of the surface acoustic wave resonator connected in series (hereinafter abbreviated as series arm resonator). As a consequence, a bandpass filter having the resonant point of the parallel arm resonator and the anti-resonant point of the series arm resonator as its attenuation poles, and having the anti-resonant point of the parallel arm resonator and the resonant point of the series arm resonator as its center frequency, is formed, and is widely used in filters for mobile telephones and other similar devices.

There is increasing use in recent mobile telephones of systems in which the transmitter side frequency band and the receiver side frequency band are close together. As a result, it becomes important to improve the steepness near the pass band. To meet these market demands, technology has been proposed to raise the steepness near the pass band, and especially in the high-region side.

For example, EP0795958A2 discloses a method of improving the steepness near the high-region side of the pass band as well as improving the amount of attenuation, by generating multiple anti-resonant points in the series arm resonators. More specifically, in this method, the gap between the reflector and the interdigital transducer (IDT) electrode in the series arm resonator is shifted from $0.5\lambda$ (where $\lambda$ is the wavelength of the surface acoustic waves, determined according to the pitch of the reflector), thereby generating a new anti-resonant point. According to this prior art reference, in the case where the gap between the IDT electrode of the series arm resonator and the reflector is within a range of $(n/2+0.55)\lambda$ to $(n/2+0.81)\lambda$ (where n is zero or a positive integer), it is possible to generate a new anti-resonant point which is at an appropriate position with respect to the original anti-resonant point and to improve the amount of attenuation in the high band side of the pass band of the ladder-type surface acoustic wave filter.

Furthermore, when the gap between the IDT electrode and the reflector is changed, the position of the newly generated anti-resonant point is changed. That is, using this technique makes it possible to move the anti-resonant point closer to the pass band, and to increase the steepness very close to the high band side of the pass band.

FIG. 1 and FIG. 2 show resonance characteristics of such a conventional surface acoustic wave filter. Here, FIG. 1 shows the relationship between impedance and frequency, and FIG. 2 shows the relationship between transmission characteristics and frequency.

As shown in FIG. 1, the conventional surface acoustic wave filter has two anti-resonant points (M1 and M2). As a consequence, the obtained surface acoustic wave filter has two attenuation poles (A1 and A2) on the high band side of the pass band, as shown in FIG. 2. The two anti-resonant points M1 and M2 in FIG. 1 correspond to the two attenuation poles A1 and A2 in FIG. 2.

In conventional surface acoustic wave filters, multiple attenuation poles are generated in the high band side of the pass band, thereby improving the attenuation characteristics near the high band side of the pass band. However, the inventors of the present application have found from the research that, in the method for raising steepness near the high band side of the pass band by generating multiple anti-resonant points, the rebound (hereinafter referred to in the present specification as sub-resonant point) between the anti-resonant points M1 and M2 cannot be ignored. That is, as shown in FIG. 2, a spurious high Q is generated at a point B1 corresponding to M3. Consequently, although the better steepness is achieved near the high band side of the pass band, there is the disadvantage of the effect of the spurious high Q adversely affecting the amount of attenuation. Furthermore, as shown in FIG. 3, this spurious high Q tends to increase as the attenuation pole A1, corresponding to the anti-resonant point M1, moves closer to the pass band. That is, it can be said that there is a trade-off between the steepness near the high band side of the pass band and the actual amount of attenuation.

Furthermore, there are conventional methods other than the method of generating multiple anti-resonant points as described above, for instance, a method of forming at least one of the gaps between the reflector electrodes in a reflector having multiple reflector electrodes to have a different size as compared to the other gaps, or a method of making at least one of the gaps between the electrode fingers of an IDT electrode multiple electrode fingers a different value from the other gaps. However, even in these and other methods for generating multiple anti-resonant points, there is still the disadvantage of generation of a spurious high Q that deteriorates the amount of attenuation.

SUMMARY OF THE INVENTION

To overcome the problems described above, preferred embodiments of the present invention provide a surface acoustic wave filter, a duplexer, and a communications device in which a steepness near the pass band on the high band side is maintained while improving the amount of attenuation in the pass band on the high band side.

According to one preferred embodiment of the present invention, a ladder-type surface acoustic wave filter includes at least two surface acoustic wave resonators provided in a series arm, and at least one parallel arm surface acoustic wave resonator in a parallel arm. At least one of the series arm surface acoustic wave resonators has a plurality of anti-resonant points and a sub-resonant point provided between the anti-resonant points, and the sub-resonant point of that series arm resonator substantially matches an anti-resonant point of the other series arm resonators. Consequently, the anti-resonant points of the other series arm resonators cancel the spurious high Q caused by the effect of the sub-resonant point, enabling the amount of attenuation at the high band side of the pass band to be improved while maintaining steepness.

In a preferred embodiment of the present invention, a surface acoustic wave filter includes a ladder type circuit having a series arm and at least one of parallel arms, first and second series arm surface acoustic wave resonators provided in the series arm, and at least one parallel arm surface acoustic wave resonator provided in each of the parallel arms, wherein the first series arm surface acoustic wave resonators has a plurality of anti-resonant points and a sub-resonant point provided therebetween, and the sub-resonant point substantially matches an anti-resonant point of the second series arm surface acoustic wave resonator.

In other preferred embodiments, the sub-resonant point is adjusted by varying the pitch or gap width of at least one electrode finger in the interdigital transducer, or the reflector, or between the outermost electrode fingers of the interdigital transducer and the reflector relative to the other pitches. Note that the pitch can be varied by changing the thickness of the electrode finger.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

A surface acoustic wave filter according to a preferred embodiment of the present invention preferably includes at least two series arm surface acoustic wave resonators provided in a series arm, and at least one parallel arm surface acoustic wave resonator provided in a parallel arm. In the surface acoustic wave filter, at least one series arm surface acoustic wave resonator has a plurality of anti-resonant points and a sub-resonant point located between the anti-resonant points, and the sub-resonant point substantially coincides with an anti-resonant point of at least one of the remaining series arm surface acoustic wave resonator.

Figure 1:
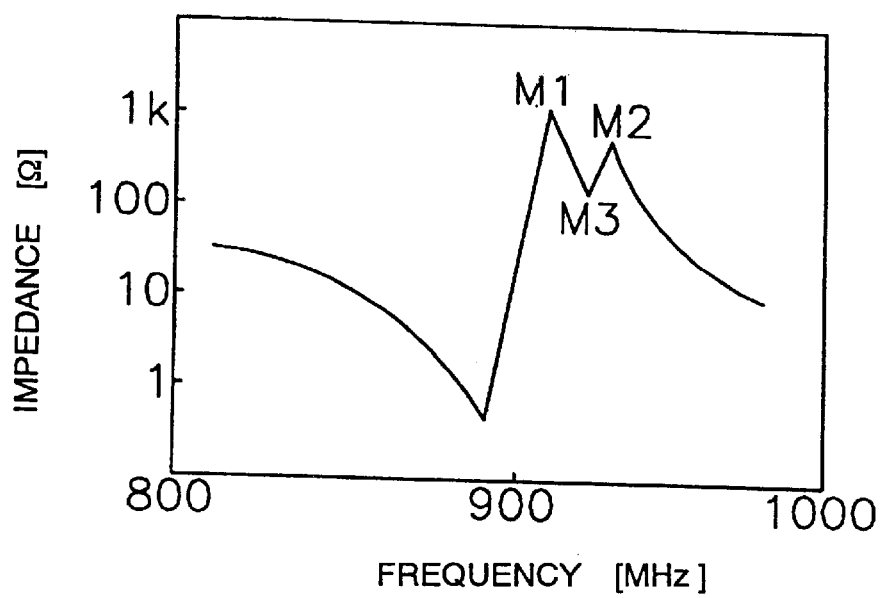
FIG. 1 is a diagram showing impedance characteristics of a conventional surface acoustic wave filter.
Figure 2:
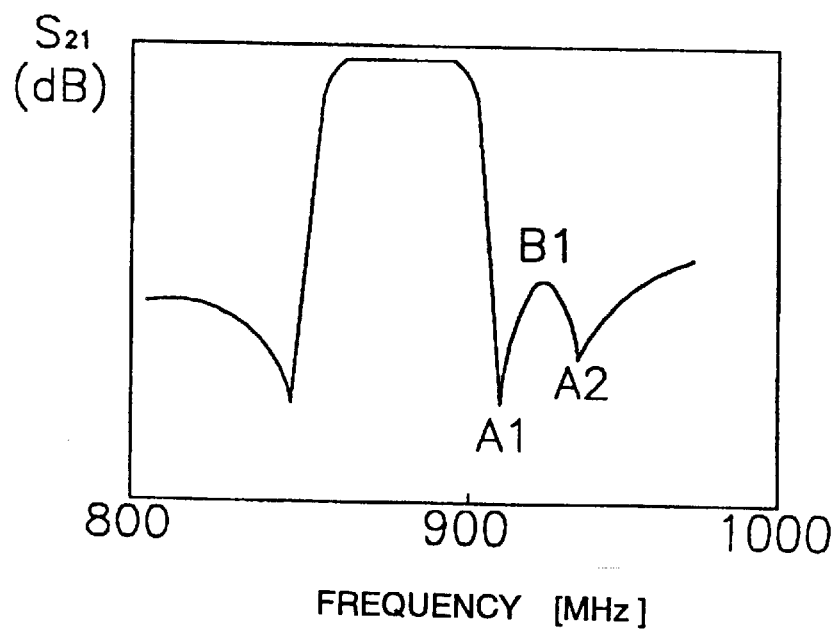
FIG. 2 is a diagram showing transmission characteristics of a conventional surface acoustic wave filter.
Figure 3:
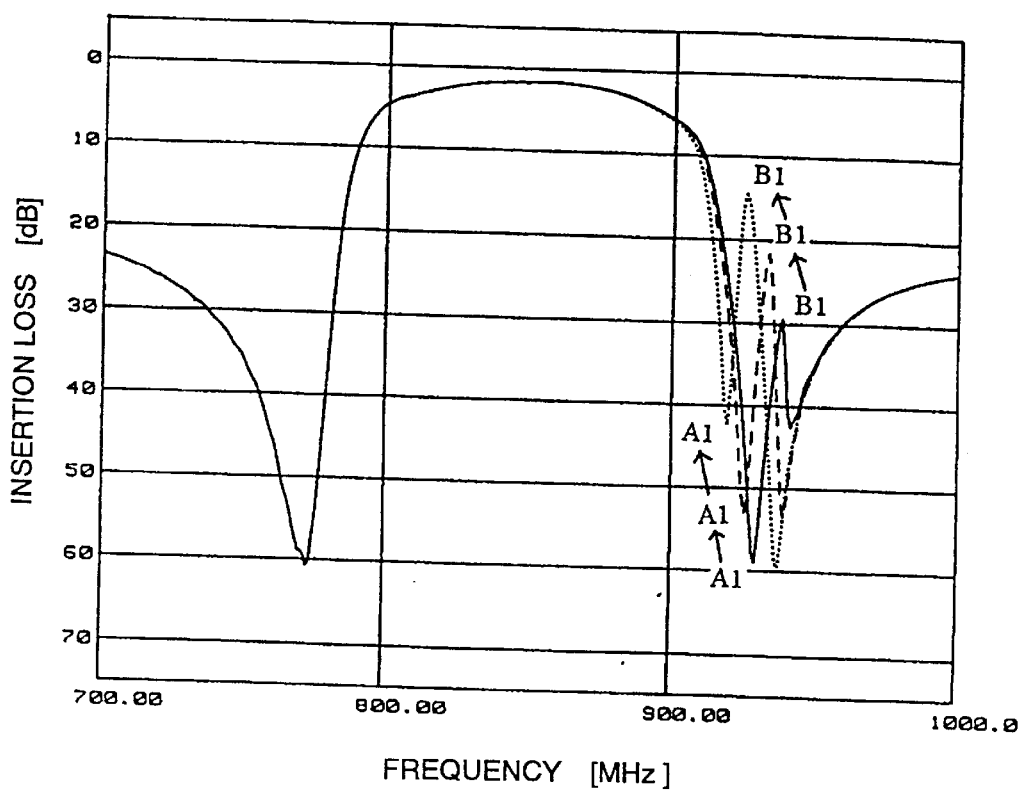
FIG. 3 is a diagram showing transmission characteristics of a conventional surface acoustic wave filter.
Figure 4:
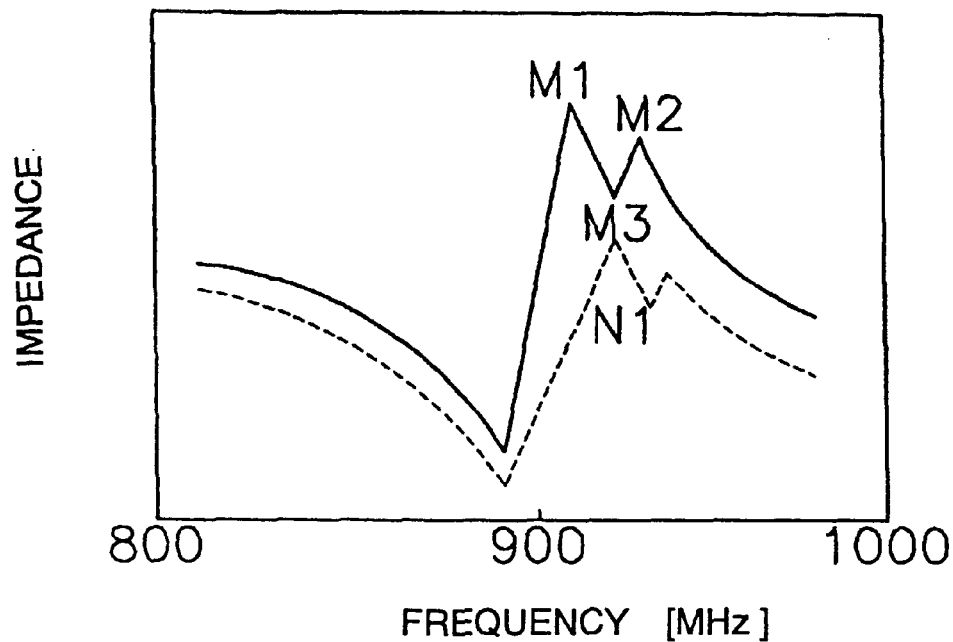
FIG. 4 is an impedance characteristics diagram illustrating a schematic outline of a preferred embodiment of the present invention.

As a result of this unique arrangement, the anti-resonant point of the series arm surface acoustic wave resonator is substantially canceled by the resonant points of the other series arm resonators, and the steepness can be maintained near the high band side of the pass band while improving the amount of attenuation. That is, as shown in FIG. 4 which shows the relationship of impedance to frequency, impedance characteristics of at least one of the series arm resonators (shown by a solid line) are different from the impedance characteristics of the other series arm resonator (shown by a broken line). A sub-resonant point M3 occurs between the multiple anti-resonant points M1 and M2, and coincides with the anti-resonant point N1 of the other series arm resonator. Consequently, M3 and N1 cancel each other out, thereby making it possible to maintain steepness near the pass band high band side while improving the amount of attenuation.

Figure 5:
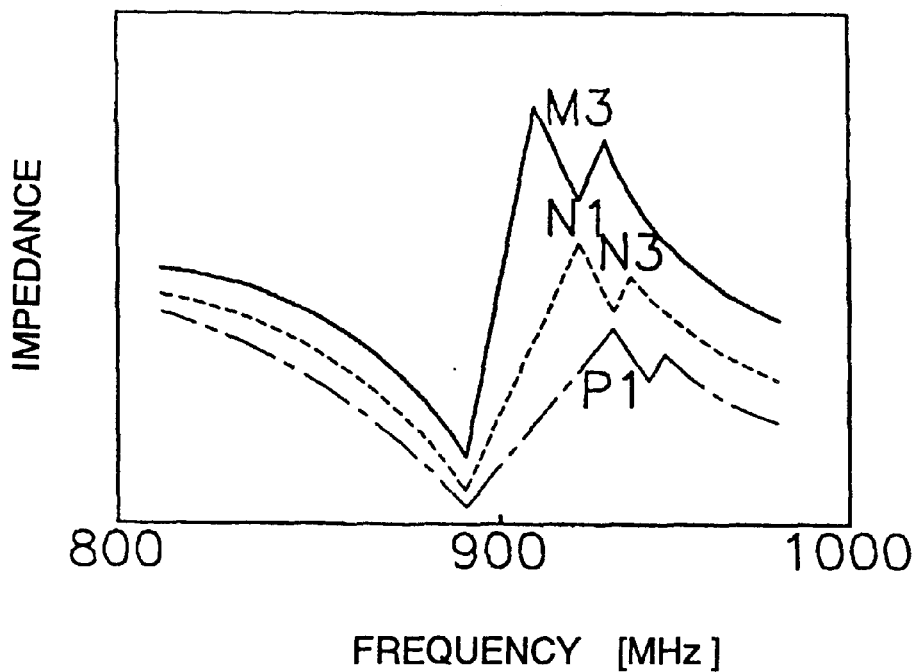
FIG. 5 is an impedance characteristics diagram illustrating a schematic outline of a preferred embodiment of the present invention.

Furthermore, in a case where three or more series arm resonators are provided, as shown in FIG. 5, the sub-resonant point M3 of the first surface acoustic wave resonator (its impedance characteristics shown by a solid line) substantially coincides with the anti-resonant point N1 of the second surface acoustic wave resonator (its impedance characteristics shown by a broken line), and the sub-resonant point N3 of the second surface acoustic wave resonator substantially coincides with the anti-resonant point P1 of the first surface acoustic wave resonator (its impedance characteristics shown by an alternate long and short dash line). By sequentially repeating these, the effects of the sub-resonant points can be eliminated, improving the steepness near the pass band high band side, and in addition, achieving a high amount of attenuation in a wider frequency range.

In order to generate a plurality of the anti-resonant points in the series arm surface acoustic wave resonator and make the sub-resonant point substantially coincide with the anti-resonant point of at least one of the remaining series arm surface acoustic wave resonator, the surface acoustic wave resonator includes an IDT having a plurality of electrode fingers which are arranged to be spaced at a predetermined distance, and at least one of the electrode fingers has a width different from that of the other electrode fingers. The width is adjusted such that the sub-resonant point substantially coincides with the anti-resonant point of at least one of the remaining series arm surface acoustic wave resonator. Alternatively, at least one of the pitches between the plurality of electrode fingers may be adjusted at a predetermined value different from the other pitches in the surface acoustic wave resonator such that the sub-resonant point substantially coincides with the anti-resonant point of at least one of the remaining series arm surface acoustic wave resonator.

Another way to generate a plurality of the anti-resonant points in the series arm surface acoustic wave resonator and make the sub-resonant point substantially coincide with the anti-resonant point of at least one of the remaining series arm surface acoustic wave resonator is that the surface acoustic wave resonator includes a pair of reflectors having a plurality of electrode fingers which are arranged at a predetermined distance on the opposite side of the IDT along the surface wave propagation direction, and at least one of the electrode fingers of the reflector has a width different from that of the other electrode fingers. The width is adjusted such that the sub-resonant point substantially coincides with the anti-resonant point of at least one of the remaining series arm surface acoustic wave resonator. At least one of the pitches between the plurality of electrode fingers may be adjusted at a predetermined value different from the other pitches in the surface acoustic wave resonator such that the sub-resonant point substantially coincides with the anti-resonant point of at least one of the remaining series arm surface acoustic wave resonator.

According to still another method, the pitch between the outermost electrode fingers of the IDT and the outermost electrode fingers of the reflector is adjusted at a value different from a value of about $\lambda/2$ with respect to a wavelength $\lambda$ at the frequency used such that the sub-resonant point substantially coincides with the anti-resonant point of at least one of the remaining series arm surface acoustic wave resonator.

Consequently, it is possible to change the impedance characteristics of the surface acoustic wave resonator, and to generate anti-resonant points and sub-resonant point of the surface acoustic wave resonator which generates multiple anti-resonant points at desired positions.

Hereinafter, preferred embodiments of the present invention are explained in more detail with reference to the drawings. In the following preferred embodiments, lengths converted to wavelength $\lambda$ in the frequency used (different in the series arm resonator and the parallel arm resonator) are shown in parenthesis as appropriate.

Figure 6:
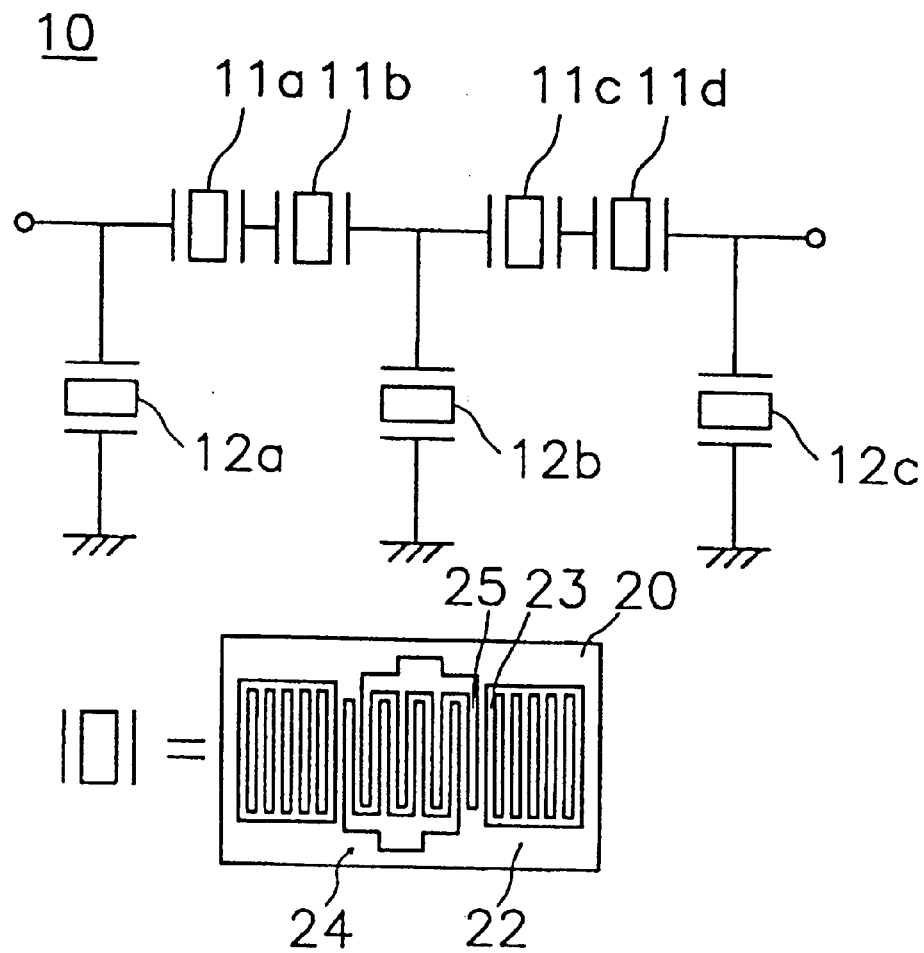
FIG. 6 is a diagram showing the structure of a surf ace acoustic wave filter according to a preferred embodiment of the present invention.

FIG. 6 shows a structure of a surface acoustic wave filter 10 according to a first preferred embodiment. In the first preferred embodiment, four series arm resonators 11a, 11b, 11c, and 11d, and three parallel arm resonators 12a, 12b, and 12c, having a reflector 22, are preferably provided and are defined by aluminum electrodes on a 41 degree Y-cut X-propagation LiNbO$_3$ substrate 20. The aperture (or overlapping length) of the IDTs in the parallel arm resonators 12a and 12c is preferably about 50 μm (9λ), the number of pair of electrode fingers of the IDTs is preferably 105, the aperture of the resonator 12b is preferably about 57 μm (10.5λ), and the number of pairs is preferably 150. The series arm resonators 11a to 11d all preferably have an aperture of about 80 μm (16λ), a number of pairs of 125, and the number of reflector electrodes 23 is eighty. Furthermore, the pitch (or gap) between the IDT electrode 24 and the reflector 22 is 0.5 (0.5λ) times the wavelength λ, determined according to the pitch of the reflector electrodes 23. Here, the gap between the IDT electrode 24 and the reflector 22 refers to the intermediate distance between an adjacent electrode finger 25 of an IDT electrode 24 and a reflector electrode 23 of the reflector 22.

Figure 7:
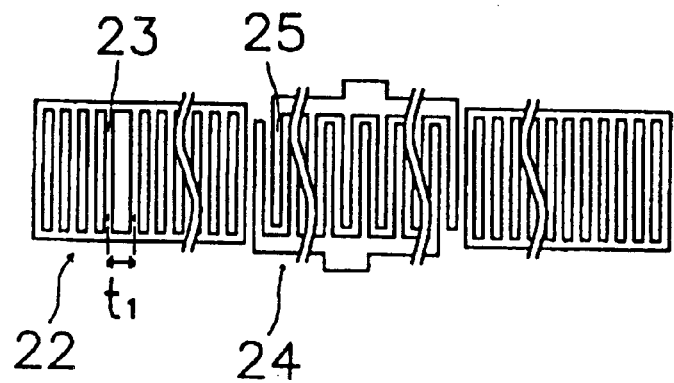
FIG. 7 is a plan view of the series arm resonator of a first preferred embodiment of the present invention.

FIG. 7 shows the structure of the series arm resonators. In the present preferred embodiment, the tenth gap between the reflector electrodes 23 from the IDT electrode 24 side is preferably wider than the other gaps. The gap $t_1$ is ordinarily about 0.5λ, but in the present preferred embodiment, the series arm resonator 11a is about 0.68λ, the series arm resonator 11b is about 0.65λ, the series arm resonator 11c is about 0.67λ, and the series arm resonator 11d is about 0.55λ.

Figure 8:
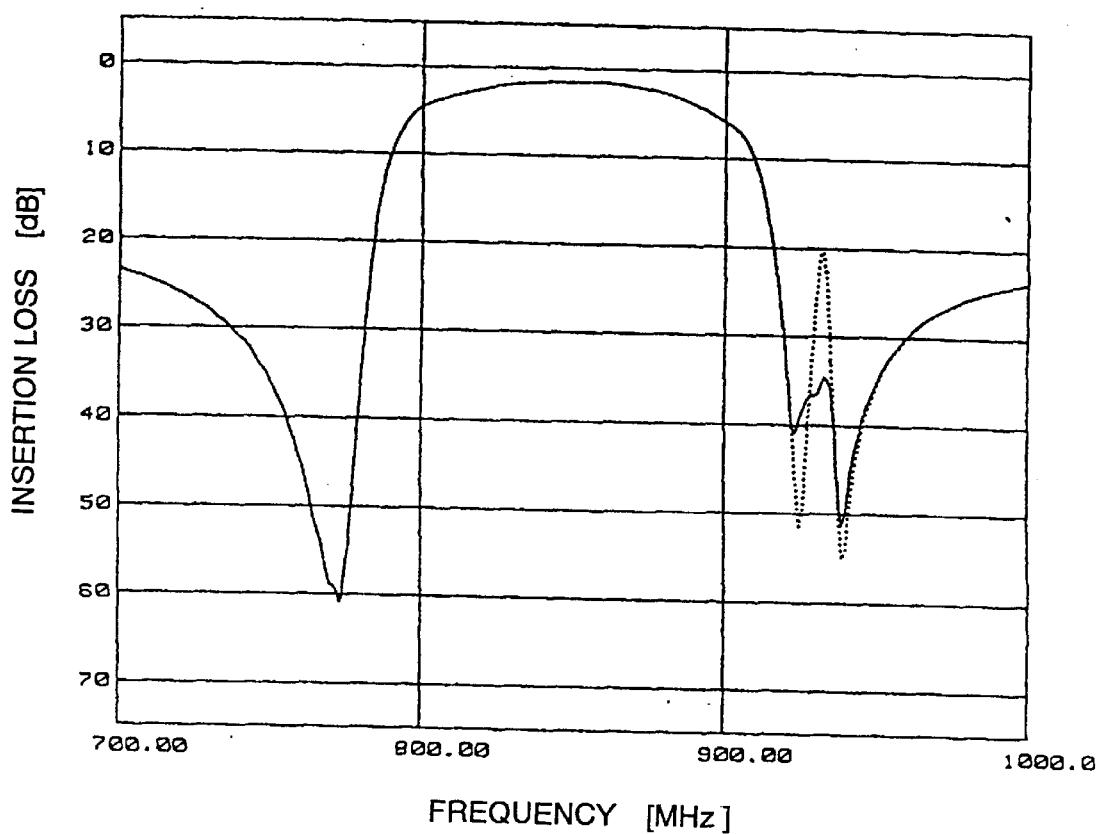
FIG. 8 is a diagram showing transmission characteristics of the first preferred embodiment and a surface acoustic wave filter of a comparative example.

FIG. 8 shows the transmission characteristics of the surface acoustic wave filter according to the present preferred embodiment as indicated by a solid line, and shows transmission characteristics of a surface acoustic wave filter of a comparative example as indicated by a broken line. In the comparative example, to obtain steepness near the high band side of the pass band similar to that of the present preferred embodiment, the gap t1 in FIG. 7 is about 0.5λ, in all the series arm resonators 11a to 11d, and the gaps between the IDT electrodes and the reflectors are all about 0.61λ.

In the surface acoustic wave filter of the present preferred embodiment, steepness near the high band side of the pass band is greatly improved at the anti-resonant points of the series arm resonators 11a and 11c, and the effect of the sub-resonant points of the series arm resonators 11a and 11c on the anti-resonant points of the series arm resonators 11b and 11d is eliminated, whereby there is no deterioration of a large amount of attenuation. By comparison with the comparative example, it can be seen that the amount of attenuation close to 920 to 940 MHz is improved by approximately 15 dB.

In the present preferred embodiment, one of the gaps between the reflector electrodes 23 is made different from the other gaps, but alternatively, one of the widths of the reflector electrodes 23 may be made different from the widths of the other reflector electrodes 23.

Next, a surface acoustic wave filter according to a second preferred embodiment of the present invention will be provided. Elements which are the same as the first preferred embodiment will not be explained.

In the present preferred embodiment, the gap between the IDT electrode 24 and the reflector 22 is preferably about 0.65λ in the series arm resonator 11a, about 0.61λ in the series arm resonator 11b, about 0.64λ in the series arm resonator 11c, and about 0.55λ in the series arm resonator 11d.

Figure 9:
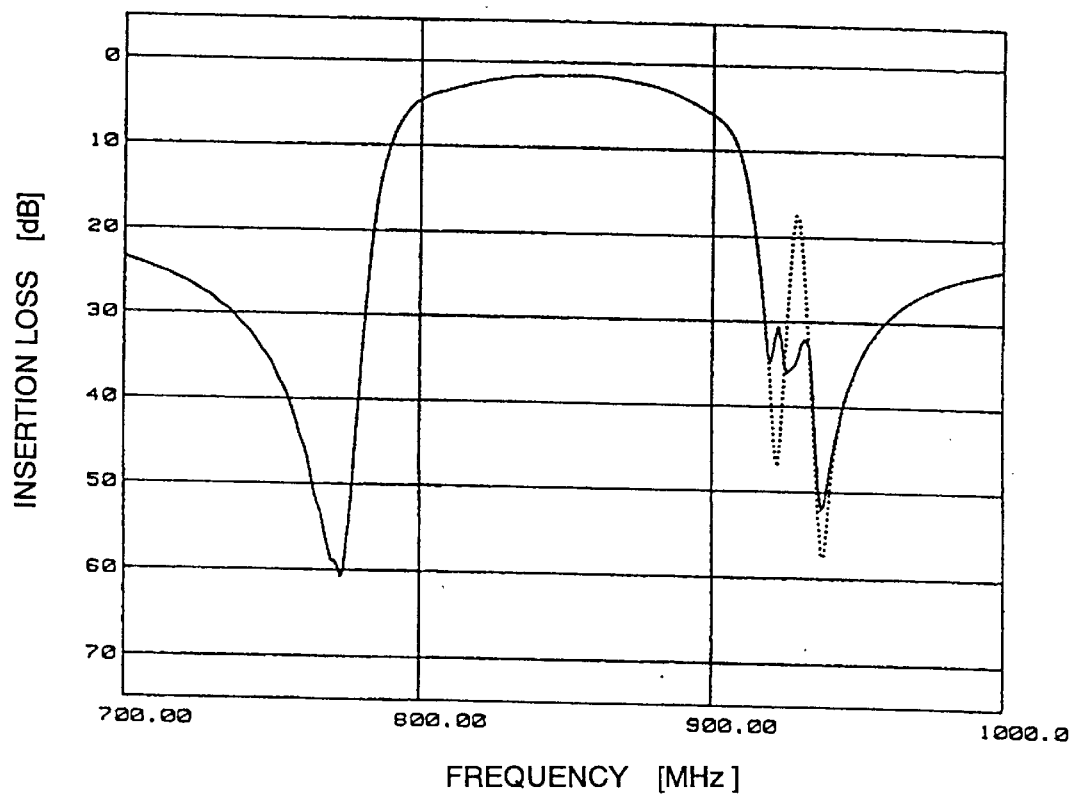
FIG. 9 is a diagram showing transmission characteristics of a surface acoustic wave filter according to a second preferred embodiment of the present invention and a comparative example.

FIG. 9 shows transmission characteristics of the surface acoustic wave filter according to the present preferred embodiment as indicated by a solid line, and shows transmission characteristics of a surface acoustic wave filter of a comparative example as indicated by a broken line. In the comparative example, to obtain steepness near the high band side of the pass band approximately similar to that of the present preferred embodiment, the gaps between the IDT electrodes and the reflectors are all about 0.63λ.

In the surface acoustic wave filter of the present preferred embodiment, the steepness near the high band side is improved at the anti-resonant points of the series arm resonators 11a and 11c, and the effects of the sub-resonant points of the series arm resonators 11a and 11c on the anti-resonant points of the series arm resonators 11b and 11d are eliminated, whereby there is no deterioration of a large amount of attenuation. In comparison with the comparative example, it can be seen that the amount of attenuation near 920 to 940 MHz is improved by approximately 14 dB.

Next, a surface acoustic wave filter according to a third preferred embodiment of the present invention will be explained. Elements which are the same as in the first preferred embodiment will not be explained.

Figure 10:
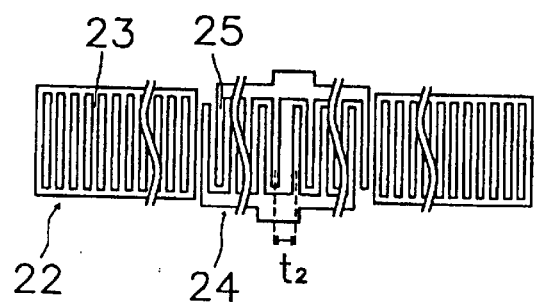
FIG. 10 is a plan view of the series arm resonator in a third preferred embodiment of the present invention.

FIG. 10 shows a structure of a series arm resonator. In the present preferred embodiment, of the gaps between the electrode fingers 25 of the IDT electrode 24, the center gap is preferably wider than the other gaps. The gap $t_2$ is ordinarily about $0.5\lambda$, but in the present preferred embodiment, the series arm resonator 11a is preferably about $0.64\lambda$, the series arm resonator 11b is about $0.61\lambda$, the series arm resonator 11c is about $0.63\lambda$, and the series arm resonator 11d is about $0.56\lambda$.

Figure 11:
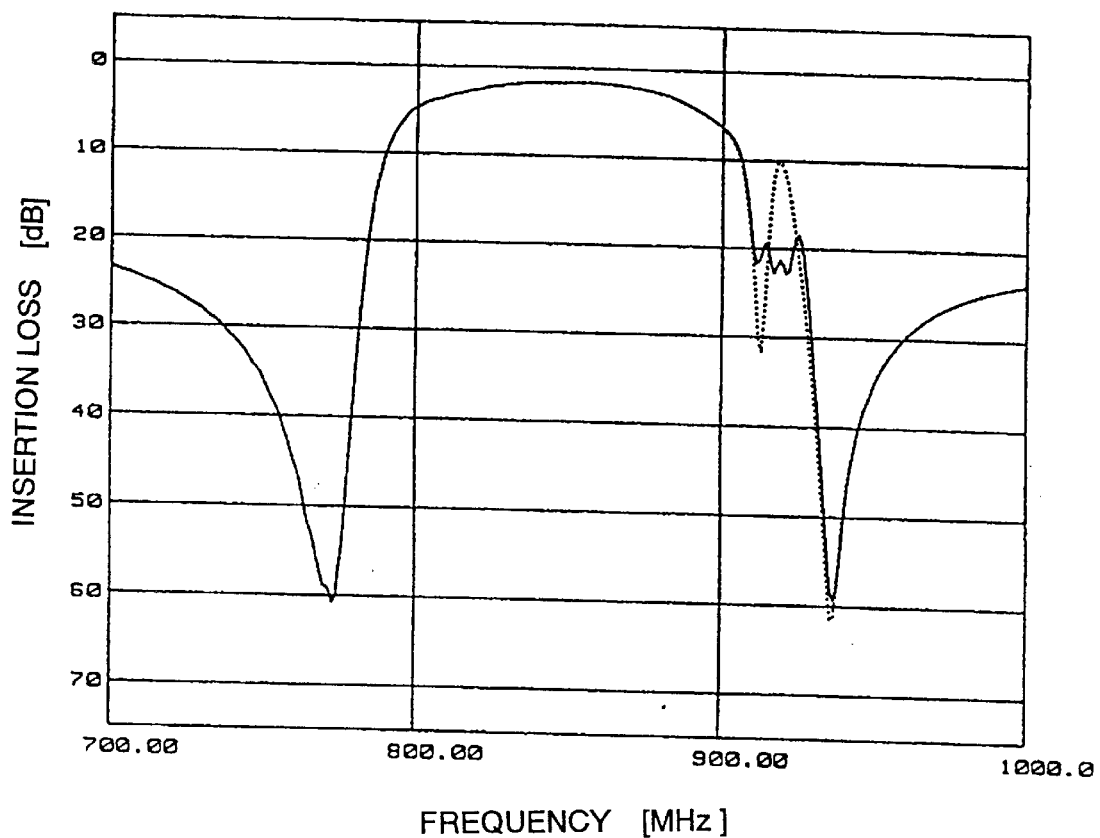
FIG. 11 is a diagram showing transmission characteristics of a surface acoustic wave filter of the third preferred embodiment and a comparative example.

FIG. 11 shows transmission characteristics of the surface acoustic wave filter according to the present preferred embodiment as indicated by a solid line, and shows transmission characteristics of a surface acoustic wave filter of a comparative example as indicated by a broken line. In the comparative example, to obtain steepness near the high band side of the pass band approximately similar to that of the present preferred embodiment, the gap $t_2$ in FIG. 10 is about $0.5\lambda$ in all the series arm resonators 11a to 11d, and the gaps between the IDT electrodes and the reflectors are all about $0.69\lambda$.

In the surface acoustic wave filter of the present preferred embodiment, the steepness near the pass band high band side is greatly improved at the anti-resonant points of the series arm resonators 11a and 11c, and the effect of the sub-resonant points of the series arm resonators 11a and 11c on the anti-resonant points of the series arm resonators 11b and 11d is eliminated, whereby there is no deterioration of a large amount of attenuation. In comparison with the comparative example, it can be seen that the amount of attenuation close to 920 to 940 MHz is improved by approximately 8 dB.

In the present preferred embodiment, one of the gaps between the electrode fingers 25 is made different from the other gaps, but alternatively, one of the widths of the electrode fingers 25 in the IDT electrode 24 may be made different from the widths of the other electrode fingers 25.

In the three preferred embodiments described above, a 41 degree Y-cut X- propagation $LiNbO_3$ substrate is preferably used as the substrate, but the present invention is not restricted to this. For example, a piezoelectric substrate such as a crystal substrate or an $LiTaO_3$ substrate, or to a substrate comprising a ZnO film provided on an insulated substrate, may also be used.

Furthermore, the various preferred embodiments described above can be combined in a single ladder-type surface acoustic wave filter, for instance by obtaining desired impedance characteristics in the series arm resonators 11a and 11b using the method of the first preferred embodiment, obtaining desired impedance characteristics in the series arm resonator 11c using the method of the second preferred embodiment, and obtaining desired impedance characteristics in the series arm resonator 11d using the method of the third preferred embodiment, and other similar combination.

Figure 12:
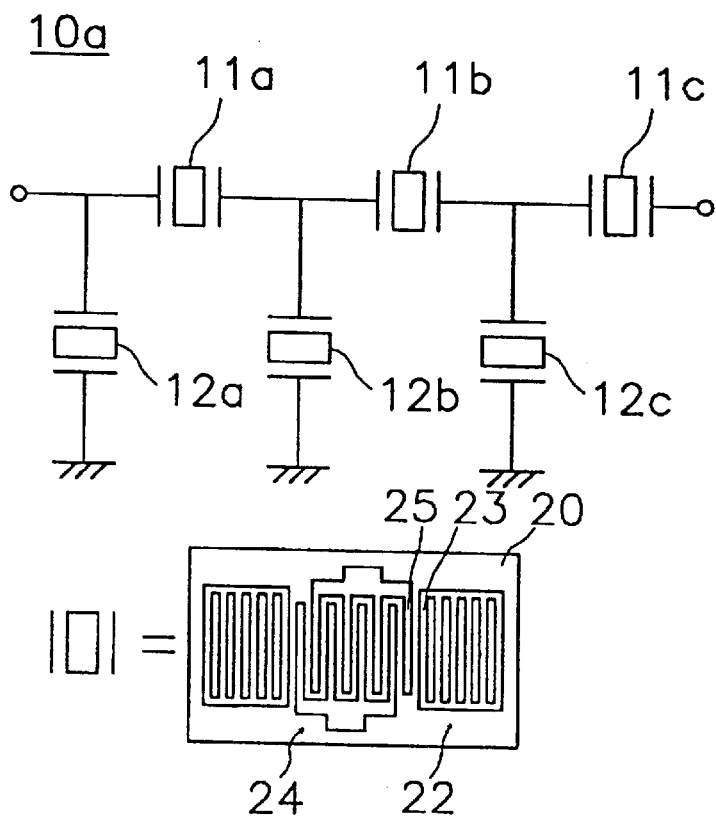
FIG. 12 is a diagram showing a constitution of another surface acoustic wave filter of a preferred embodiment of the present invention.

Moreover, FIG. 6 illustrates the structure of the surface acoustic wave filter, but the surface acoustic wave filter of preferred embodiments of the present invention may have at least two surface acoustic wave resonators. That is, the present invention can be applied to surface acoustic wave filters of various arrangements and constitutions, such as the surface acoustic wave filter 10a shown in FIG. 12, in which a series arm surface acoustic wave resonator and a parallel arm surface acoustic wave resonator are alternately connected.

Next, a duplexer according to another preferred embodiment of the present invention will be explained based on FIG. 13. FIG. 14 is a schematic view of the duplexer of the present preferred embodiment.

Figure 13:
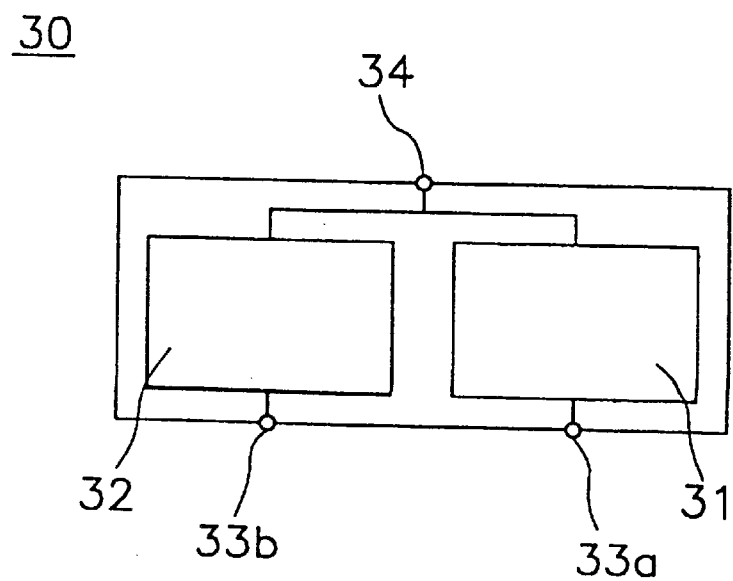
FIG. 13 is a schematic view of a duplexer according to a preferred embodiment of the present invention.
Figure 14:
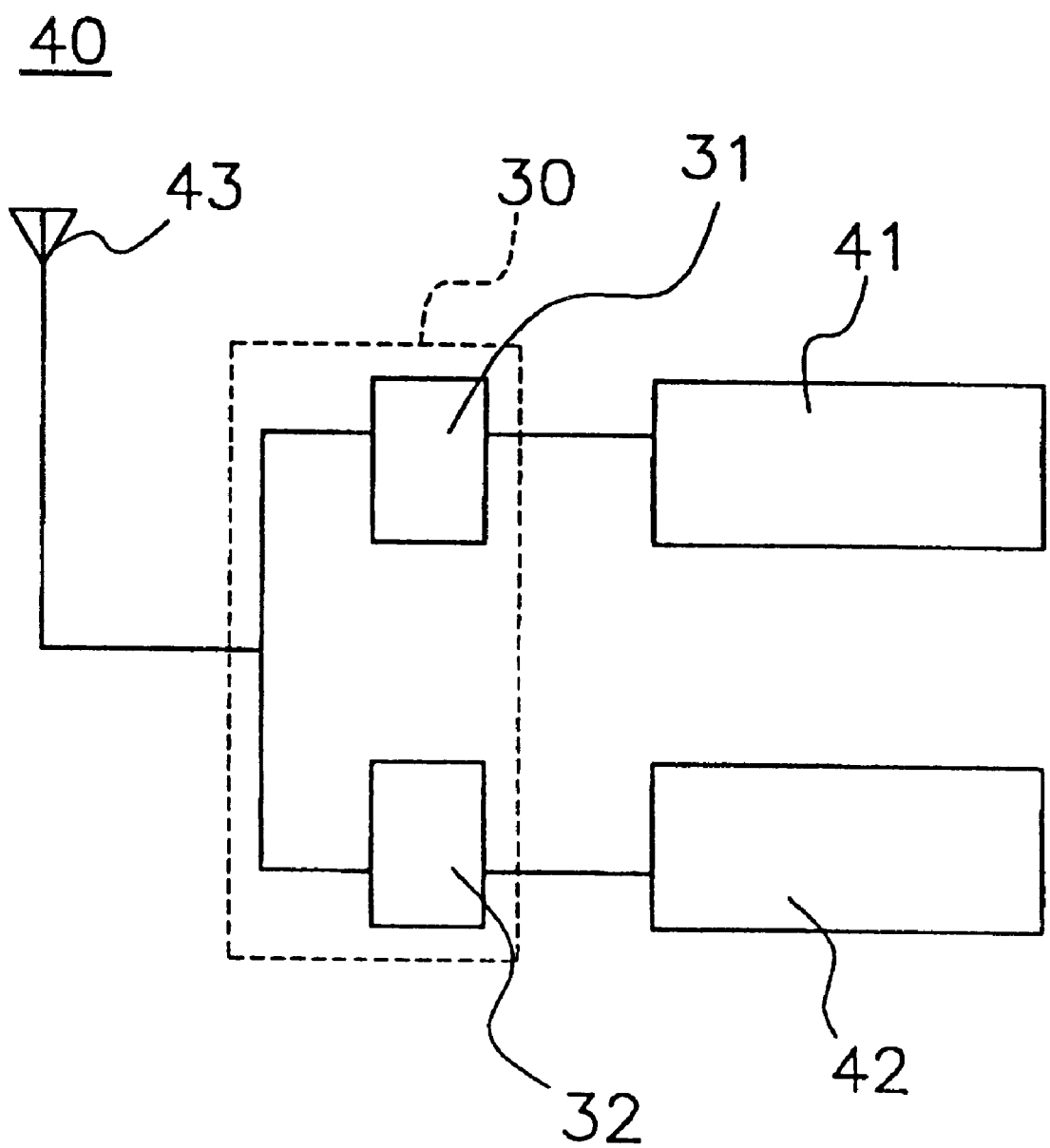
FIG. 14 is a schematic view of a communications device according to a preferred embodiment of the present invention.

As shown in FIG. 13, the duplexer 30 of the present preferred embodiment includes a filter for transmitting 31 and a filter for receiving 32, and terminals for input/output connection 33a and 33b are provided on the input side of the filter for transmitting 31 and the output side of the filter for receiving 32. Furthermore, the output side of the filter for transmitting 31 and the input side of the filter for receiving 32 are integrated at a terminal for antenna connection 34. The filter for transmitting 31 and the filter for receiving 32 in this duplexer 30 are filters of the type in the above-described preferred embodiments, only signals in a predetermined frequency band being allowed to pass at the filter for transmitting 31, and only signals in a frequency band different to the frequency band of the filter for transmitting 31 being allowed to pass at the filter for receiving 32.

Moreover, a communications device according to a preferred embodiment of the present invention will be explained based on FIG. 13. FIG. 13 is a schematic view of the communications device of the present preferred embodiment.

As shown in FIG. 14, the communications device 40 of the present preferred embodiment includes the duplexer 30, a circuit for transmitting 41, a circuit for receiving 42, and an antenna 43. Here, the duplexer 30 is that shown in the preceding preferred embodiment, a terminal for input/output connection 32a is connected to the filter for transmitting 31 in FIG. 13 and connects to the circuit for transmitting 41, and a terminal for input/output connection 33b is connected to the filter for receiving 32 and connects to the circuit for receiving 42. Furthermore, the terminal for antenna connection 34 connects to the antenna 43.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A surface acoustic wave filter comprising:
   a series arm including at least two series arm surface acoustic wave resonators;
   a parallel arm including at least one parallel arm surface acoustic wave resonator;
   wherein the first series arm surface acoustic wave resonator has a plurality of anti-resonant points and a sub-resonant point provided between the anti-resonant points, and the sub-resonant point substantially matches an anti-resonant point of the second series arm surface acoustic wave resonator.

2. The surface acoustic wave filter according to claim 1, wherein the first series arm surface acoustic wave resonator has an interdigital transducer having a plurality of electrode fingers which are arranged at a predetermined distance from each other, and wherein at least one of the electrode fingers has a width different from that of the other electrode fingers.

3. The surface acoustic wave filter according to claim 1, wherein the first series arm surface acoustic wave resonator has an interdigital transducer having a plurality of electrode fingers which are arranged at a predetermined distance from each other, and at least one pitch that is between the electrode fingers is different from other pitches between the electrode fingers of the interdigital transducer.

4. The surface acoustic wave filter according to claim 1, wherein the first series arm surface acoustic wave resonator includes an interdigital transducer, and first and second reflectors, the first and second reflectors are located next to a first side and a second side of the interdigital transducer, respectively, along a direction of propagation of a surface wave, the first and second reflectors have a plurality of electrode fingers, the electrode fingers are arranged so as to be separated by a predetermined distance, and at least one of the electrode fingers of at least one of the first and second reflectors has a width different from that of the other electrode fingers.

5. The surface acoustic wave filter according to claim 1, wherein the first series arm surface acoustic wave resonator includes an interdigital transducer, and first and second reflectors, the first and second reflectors are located next to a first and second side of the interdigital transducer, respectively, along a direction of propagation of a surface wave, the first and second reflectors have a plurality of electrode fingers, the electrode fingers are arranged so as to be separated by a predetermined distance, and at least one pitch between the plurality of electrode fingers is different from other pitches between the electrode fingers in at least one of the first and second reflectors.

6. The surface acoustic wave filter according to claim 1, wherein the first series arm surface acoustic wave resonator includes an interdigital transducer, and first and second reflectors that are provided on opposite sides of the interdigital transducer along a direction of propagation of a surface acoustic wave, wherein a pitch between an outermost electrode finger of the interdigital transducer and an outermost electrode finger of at least one of the first and second reflectors is different from a value of about $\lambda/2$, where $\lambda$ denotes a wave length of the surface acoustic wave excited in the surface acoustic wave filter.

7. A duplexer comprising:
   first and second filters;
   first and second input/output connectors connected to the first and second filters, respectively; and
   an antenna connector for connecting to an antenna, the antenna connector being connected to the first and second filters;
   wherein at least one of the filters is a surface acoustic wave filter including a series arm including at least two series arm surface acoustic wave resonators;
   a parallel arm including at least one parallel arm surface acoustic wave resonator;
   wherein the first series arm surface acoustic wave resonator has a plurality of anti-resonant points and a sub-resonant point provided between the anti-resonant points, and the sub-resonant point substantially matches an anti-resonant point of the second series arm surface acoustic wave resonator.

8. The duplexer according to claim 7, wherein the first series arm surface acoustic wave resonator has an interdigital transducer having a plurality of electrode fingers which are arranged at a predetermined distance from each other, and wherein at least one of the electrode fingers has a width different from that of the other electrode fingers.

9. The duplexer according to claim 7, wherein the first series arm surface acoustic wave resonator has an interdigital transducer having a plurality of electrode fingers which are arranged at a predetermined distance from each other, and at least one pitch that is between the electrode fingers is different from other pitches between the electrode fingers of the interdigital transducer.

10. The duplexer according to claim 7, wherein the first series arm surface acoustic wave resonator includes an interdigital transducer, and first and second reflectors, the first and second reflectors are located next to a first and second side of the interdigital transducer, respectively, along a direction of propagation of a surface wave, the first and second reflectors have a plurality of electrode fingers, the electrode fingers are arranged so as to be separated by a predetermined distance, and at least one of the electrode fingers of at least one of the first and second reflectors has a width different from that of the other electrode fingers.

11. The duplexer according to claim 7, wherein the first series arm surface acoustic wave resonator includes an interdigital transducer, and first and second reflectors, the first and second reflectors are located next to a first and second side of the interdigital transducer, respectively, along a direction of propagation of a surface wave, the first and second reflectors have a plurality of electrode fingers, the electrode fingers are arranged so as to be separated by a predetermined distance, and at least one pitch between the plurality of electrode fingers is different from other pitches between the electrode fingers in at least one of the first and second reflectors.

12. The duplexer according to claim 7, wherein the first series arm surface acoustic wave resonator includes an interdigital transducer, and first and second reflectors provided on opposite sides of the interdigital transducer along a direction of propagation of a surface acoustic wave, wherein a pitch between an outermost electrode finger of the interdigital transducer and an outermost electrode finger of at least one of the first and second reflectors is made different from a value of about $\lambda/2$, where $\lambda$ denotes a wave length of the surface acoustic wave excited on the surface acoustic wave filter.

13. A communications device comprising:
   a duplexer including first and second filters, first and second input/output connectors connected to the first and second filters, respectively, and an antenna connector for connecting to an antenna, the antenna connector being connected to the first and second filters;
   a receiver connected to the first input/output connectors;
   a transmitter connected to the second input/output connectors; and
   an antenna connected to the antenna connector;
   wherein at least one of the filters is a surface acoustic wave filter including a series arm including at least two series arm surface acoustic wave resonators, a parallel arm including at least one parallel arm surface acoustic wave resonator; and the first series arm surface acoustic wave resonator has a plurality of anti-resonant points and a sub-resonant point provided between the anti-resonant points, and the sub-resonant point substantially matches an anti-resonant point of the second series arm surface acoustic wave resonator.

14. The device according to claim 13, wherein the first series arm surface acoustic wave resonator has an interdigital transducer having a plurality of electrode fingers which are arranged at a predetermined distance from each other, and wherein at least one of the electrode fingers has a width different from that of the other electrode fingers.

15. The device according to claim 13, wherein the first series arm surface acoustic wave resonator has an interdigital transducer having a plurality of electrode fingers which are arranged at a predetermined distance from each other, and at least one pitch that is between the electrode fingers is different from other pitches between the electrode fingers of the interdigital transducer.

16. The device according to claim 13, wherein the first series arm surface acoustic wave resonator includes an interdigital transducer, and first and second reflectors, the first and second reflectors are located next to a first and second side of the interdigital transducer, respectively, along a direction of propagation of a surface wave, the first and second reflectors have a plurality of electrode fingers, the electrode fingers are arranged so as to be separated by a predetermined distance, and at least one of the electrode fingers of at least one of the first and second reflectors has a width different from that of the other electrode fingers.

17. The device according to claim 13, wherein the first series arm surface acoustic wave resonator includes an interdigital transducer, and first and second reflectors, wherein the first and second reflectors are located next to a first and second side of the interdigital transducer, respectively, along a direction of propagation of a surface wave, the first and second reflectors have a plurality of electrode fingers, the electrode fingers are arranged so as to be separated by a predetermined distance, and at least one pitch between the plurality of electrode fingers is different from other pitches of the electrode fingers in at least one of the first and second reflectors.

18. The device according to claim 13, wherein the first series arm surface acoustic wave resonator comprises an interdigital transducer, and first and second reflectors that are provided on opposite sides of the interdigital transducer along a direction of propagation of a surface acoustic wave, a pitch between an outermost electrode finger of the interdigital transducer and an outermost electrode finger of at least one of the first and second reflectors is made different from a value of about $\lambda/2$, where $\lambda$ denotes a wave length of the surface acoustic wave excited on the surface acoustic wave filter.

* * * * *